(12) United States Patent
Chu et al.

(10) Patent No.: US 10,809,011 B2
(45) Date of Patent: Oct. 20, 2020

(54) HEAT SINK

(71) Applicant: FURUKAWA ELECTRIC CO., LTD., Tokyo (JP)

(72) Inventors: Kuang Yu Chu, Taipei (TW); Masaaki Yamamoto, Tokyo (JP); Hung Wei Tseng, Taipei (TW); Masahiro Meguro, Tokyo (JP); Masato Watanabe, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 16/660,440

(22) Filed: Oct. 22, 2019

(65) Prior Publication Data

US 2020/0049418 A1 Feb. 13, 2020

Related U.S. Application Data

(63) Continuation of application No. PCT/JP2018/032059, filed on Aug. 30, 2018.

(30) Foreign Application Priority Data

Aug. 31, 2017 (JP) .................................. 2017-166826

(51) Int. Cl.
*F28D 15/00* (2006.01)
*F28D 15/02* (2006.01)
(Continued)

(52) U.S. Cl.
CPC ..... *F28D 15/0275* (2013.01); *F28D 15/0233* (2013.01); *H01L 23/427* (2013.01); *F28D 2021/0029* (2013.01)

(58) Field of Classification Search
CPC ............. F28D 15/0275; F28D 15/0233; F28D 2021/0029; H01L 23/427
(Continued)

(56) References Cited

U.S. PATENT DOCUMENTS 7,277,285 B2 * 10/2007 Shih .................... F28D 15/0233
361/700
7,414,848 B2 * 8/2008 Zhou ..................... H01L 23/427
165/104.33
(Continued)

FOREIGN PATENT DOCUMENTS

JP     H11351769 A    12/1999
JP     2003249611 A    9/2003
(Continued)

OTHER PUBLICATIONS

English translation of Notice of Allowance received in JP Application No. 2017-166826 dated Jul. 30, 2018.
(Continued)

*Primary Examiner* — Claire E Rojohn, III
(74) *Attorney, Agent, or Firm* — Dorsey & Whitney LLP

(57) ABSTRACT

Provided is a heat sink where the formation of a boundary layer on surfaces of heat radiating fins is suppressed so that portions other than on the windward side along the cooling air flow can also exhibit excellent heat radiation property.

The heat sink includes: a base plate; a first heat radiating fin thermally connected to the base plate; and a second heat radiating fin disposed adjacently to a side end portion of the first heat radiating fin, and thermally connected to the base plate, wherein a surface of the first heat radiating fin is not parallel to a surface of the second heat radiating fin, and at least one of the second heat radiating fins is disposed at a position lower than at least one of the first heat radiating fins in a vertical direction with respect to a front surface of the base plate.

6 Claims, 9 Drawing Sheets

(51) Int. Cl.
*H01L 23/427* (2006.01)
*F28D 21/00* (2006.01)

(58) Field of Classification Search
USPC .................................................. 165/104.19
See application file for complete search history.

(56) References Cited

U.S. PATENT DOCUMENTS

| | | | | |
|---|---|---|---|---|
| 7,841,721 B2 * | 11/2010 | Momose | ................ | G03B 21/16 |
| | | | | 353/54 |
| 8,934,248 B2 * | 1/2015 | Thrailkill | .............. | F21V 29/004 |
| | | | | 361/710 |
| 2006/0196640 A1 * | 9/2006 | Siu | ........................ | H01L 23/433 |
| | | | | 165/104.26 |
| 2006/0273137 A1 * | 12/2006 | Chen | ..................... | H01L 23/427 |
| | | | | 228/101 |
| 2018/0080717 A1 * | 3/2018 | Kawabata | .............. | H01L 23/36 |
| 2019/0323779 A1 | 10/2019 | Kawabata et al. | | |

FOREIGN PATENT DOCUMENTS

| | | | |
|---|---|---|---|
| JP | 3104468 U | 7/2004 | |
| JP | 2011094888 A | 5/2011 | |
| JP | 2015164166 A | 9/2015 | |
| JP | 2017059768 A | 3/2017 | |
| TW | 201719103 A | 6/2017 | |

OTHER PUBLICATIONS

English translation of Notification of Reasons for Refusal received in JP Application No. 2017-166826 dated Mar. 12, 2018.
International Search Report and Written Opinion received in PCT Application No. PCT/JP2018/032059 dated Nov. 6, 2018 (Engl. Translation of ISR only).
English translation of Office Action for TW Application No. 107130532, dated Feb. 26, 2020.
English translation of International Preliminatry Report on Patentability for Application No. PCT/JP2018/032059, dated Mar. 3, 2020.
English translation of Written Opinion for Application No. PCT/JP2018/032059, dated Nov. 6, 2018.
English translation of First Notice of Reasons for Rejection for CN Application No. 201890000466.3, dated Apr. 15, 2020.
English translation of the Second Office Action received in CN utility model application No. 201890000466.3 dated Aug. 5, 2020.

* cited by examiner

HEAT SINK

CROSS REFERENCE TO RELATED APPLICATIONS

The present application is a continuation application of International Patent Application No. PCT/JP2018/032059 filed on Aug. 30, 2018, which claims the benefit of Japanese Patent Application No. 2017-166826, filed on Aug. 31, 2017. The contents of these applications are incorporated herein by reference in their entirety.

BACKGROUND

Technical Field

The present disclosure relates to a heat sink for cooling a heat generating element, and more specifically relates to a heat sink for cooling an electronic component mounted on a mobile body such as a railway vehicle, an aircraft or an automobile, or on an electronic apparatus.

Background

Conventionally, as a heat sink, there has been proposed a heat radiator which includes: first heat pipes each having a first end portion, a first straight portion formed of a straight pipe continuously formed with the first end portion, a bent portion formed of a curved pipe continuously formed with the first straight portion, a second straight portion continuously formed with the bent portion and formed of a straight pipe disposed parallel to the first straight portion, and a second end portion continuously formed with the second straight portion; a first base brought into contact with a circuit, and having a first surface on a side opposite to the circuit which is joined to the first straight portion; a plurality of first fins each formed of a flat plate perpendicular to the first straight portion, intersecting with the second straight portion and arranged on the first surface; a second base having a second surface perpendicular to the first base and the first straight portion and joined to the first heat pipe; and a plurality of second fins perpendicular to the second surface and arranged on the second surface (Japanese Laid-Open Patent Publication No. 2011-94888).

In the heat radiator disclosed in Japanese Laid-Open Patent Publication No. 2011-94888, in addition to the first heat sink which includes the plurality of first fins, a second heat sink is also provided which includes the plurality of second fins arranged perpendicular to the first heat sink so that heat radiation efficiency is improved.

However, in the heat radiator disclosed in Japanese Laid-Open Patent Publication No. 2011-94888, the first fins each having a flat plate shape are arranged in parallel at predetermined intervals. Accordingly, a boundary layer where a flow of cooling air is stagnated is formed on surfaces of the first fins so that heat radiation characteristics of the heat radiator are lowered particularly at leeward side portions of the surfaces of the first fins.

Assume a heat sink where heat radiating fins having a flat plate shape are mounted on a heat pipe having a U shape as viewed in a side view, and the heat pipe is installed such that the U shape of the heat pipe is parallel to cooling air. In the case of such a heat sink, with respect to a portion of each heat radiating fin positioned between straight portions of the U shape of the heat pipe, an area in the vicinity of a center portion of such a portion of each heat radiating fin is at a distance from the straight portions of the heat pipe. Accordingly, heat radiation efficiency of the heat radiating fins is lowered.

SUMMARY

The present disclosure is related to providing a heat sink where the formation of a boundary layer on surfaces of heat radiating fins is suppressed so that portions other than on the windward side along the cooling air flow can also exhibit excellent heat radiation property.

An aspect of the present disclosure is directed to a heat sink which includes: a base plate; at least one first heat radiating fin thermally connected to the base plate; and at least one second heat radiating fin disposed adjacently to a side end portion of the first heat radiating fin and thermally connected to the base plate, wherein a surface of the first heat radiating fin is not parallel to a surface of the second heat radiating fin, and at least one of the second heat radiating fins is disposed at a position lower than at least one of the first heat radiating fins in a vertical direction with respect to a front surface of the base plate.

In the above-mentioned aspect, at least one of the second heat radiating fins is provided at a position lower than at least one of the first heat radiating fins, that is, at a position closer to the base plate. In the above-mentioned aspect, the first heat radiating fin and the second heat radiating fin are arranged in a state where the surface of the first heat radiating fin and the surface of the second heat radiating fin are not parallel to each other. That is, the second heat radiating fin is arranged such that the surface of the second heat radiating fin makes an angle of more than 0° and less than 90° with respect to the surface of the first heat radiating fin. Accordingly, when cooling air is supplied from the first heat radiating fin side or the second heat radiating fin side, a disturbance in the flow of the cooling air is generated between the first heat radiating fin and the second heat radiating fin.

An aspect of the present disclosure is directed to a heat sink where a plurality of the second heat radiating fins are arranged along the front surface of the base plate to form a group of second heat radiating fins, and at least the second heat radiating fin disposed at a center portion of the group of second heat radiating fins is disposed at a position lower than at least one of the first heat radiating fins.

An aspect of the present disclosure is directed to a heat sink where a lower end portion of the second heat radiating fin comes into contact with the base plate so that the second heat radiating fin is thermally connected to the base plate.

An aspect of the present disclosure is directed to a heat sink where a shielding member is further provided to a free end of the second heat radiating fin on a side opposite to the lower end portion of the second heat radiating fin, the shielding member shielding the free end from an external environment.

An aspect of the present disclosure is directed to a heat sink where the first heat radiating fin is thermally connected to the base plate through a heat conductive member.

The term "heat conductive member" means a member having excellent thermal conductivity, and a heat pipe or metal (for example, aluminum, copper or the like) having thermal conductivity of 100 W/(m·K) or more at 25° C. can be named.

An aspect of the present disclosure is directed to a heat sink which further includes a third heat radiating fin disposed adjacently to a side end portion of the second heat radiating fin and thermally connected to the base plate, wherein a surface of the third heat radiating fin is not parallel to the surface of the second heat radiating fin.

In the above-mentioned aspect, the second heat radiating fin and the third heat radiating fin are arranged in a state where the surface of the second heat radiating fin and the surface of the third heat radiating fin are not parallel to each other. That is, the third heat radiating fin is arranged such that the surface of the third heat radiating fin makes an angle of more than 0° and less than 90° with respect to the surface of the second heat radiating fin. Accordingly, when cooling air is supplied from the third heat radiating fin side or the first heat radiating fin side, a disturbance in the flow of the cooling air is generated between the second heat radiating fin and the third heat radiating fin.

An aspect of the present disclosure is directed to a heat sink where at least one of the second heat radiating fins is disposed at a position lower than at least one of the third heat radiating fins in a vertical direction with respect to a front surface of the base plate.

In the above-mentioned aspect, at least one of the second heat radiating fins is disposed at a position closer to the base plate than at least one of the third heat radiating fins.

An aspect of the present disclosure is directed to a heat sink where the third heat radiating fin is thermally connected to the base plate through a heat conductive member.

An aspect of the present disclosure is directed to a heat sink where the heat conductive member is a heat pipe.

An aspect of the present disclosure is directed to a heat sink where a shape of the heat pipe is a U shape as viewed in a side view, an L shape as viewed in a side view or a laid-down U shape as viewed in a side view.

According to the aspect of the present disclosure, at least one of the second heat radiating fins is disposed at a position lower than at least one of the first heat radiating fins and hence, heat density of the second heat radiating fins increases whereby the second heat radiating fins exhibit excellent heat radiation efficiency. Further, at least one of the second heat radiating fins is disposed at a position lower than at least one of the first heat radiating fins and hence, it is possible to reduce a pressure loss of cooling air which flows through the second heat radiating fins and on the leeward side of the second heat radiating fins. Accordingly, in the mode of the present disclosure, portions other than on the windward side along the cooling air flow can also exhibit excellent heat radiation property. Further, according to the aspect of the present disclosure, at least one of the second heat radiating fins is disposed at a position lower than at least one of the first heat radiating fins and hence, the weight of the heat sink can be reduced.

According to an aspect of the present disclosure, the first heat radiating fin and the second heat radiating fin are arranged in a state where the surface of the first heat radiating fin and the surface of the second heat radiating fin are not parallel to each other. Accordingly, when cooling air is supplied from the first heat radiating fin side or the second heat radiating fin side, the formation of a boundary layer is suppressed between the first heat radiating fin and the second heat radiating fin and hence, the lowering of heat radiation efficiency of the heat radiating fins can be prevented. Further, between the first heat radiating fins and the second heat radiating fins, a disturbance in the flow of the cooling air is generated, that is, the cooling air becomes agitated and hence, a rate of heat transfer between the heat radiating fins and the cooling air can be enhanced.

According to the aspect of the present disclosure, at least the second heat radiating fin disposed at the center portion of the group of second heat radiating fins is disposed at a position lower than at least one of the first heat radiating fins. Accordingly, cooling air supplied to the heat sink can further efficiently flow to the leeward side of the group of second heat radiating fins and hence, heat radiation property can be further improved.

According to the aspect of the present disclosure, the shielding member is further provided to the free end side of the second heat radiating fins and hence, it is possible to prevent cooling air supplied to the heat sink from flowing out to the outside from the free ends of the second heat radiating fins. Accordingly, cooling air can more efficiently flow to the leeward side of the group of second heat radiating fins, and, as a result, heat radiation property can be further improved.

According to an aspect of the present disclosure, the heat sink further includes the third heat radiating fin disposed adjacently to the side end portion side of the second heat radiating fin, and the second heat radiating fin and the third heat radiating fin are arranged in a state where the surface of the second heat radiating fin and the surface of the third heat radiating fin are not parallel to each other. Accordingly, when cooling air is supplied from the first heat radiating fin side or the third heat radiating fin side, the formation of a boundary layer can be suppressed not only between the first heat radiating fin and the second heat radiating fin but also between the second heat radiating fin and the third heat radiating fin and hence, the lowering of heat radiation efficiency of the heat radiating fins can be further prevented. Further, a disturbance in the flow of the cooling air is generated not only between the first heat radiating fin and the second heat radiating fin but also between the second heat radiating fin and the third heat radiating fin. Accordingly, a rate of heat transfer between the heat radiating fins and the cooling air can be further enhanced.

DETAILED DESCRIPTION

Hereinafter, a heat sink according to a first embodiment of the present disclosure will be described with reference to drawings.

Figure 1:
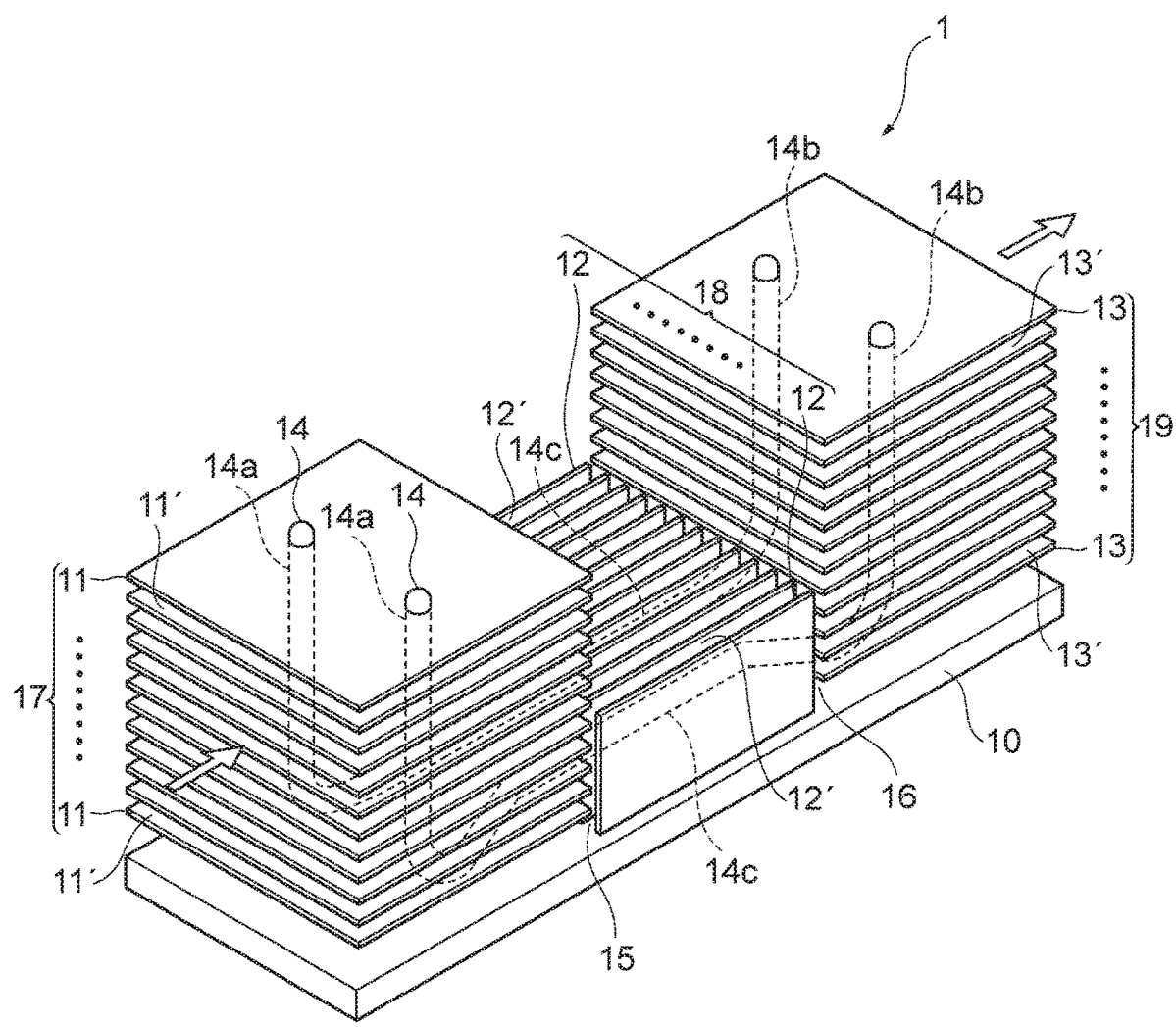
FIG. 1 is a perspective view of a heat sink according to a first embodiment of the present disclosure.
Figure 2:
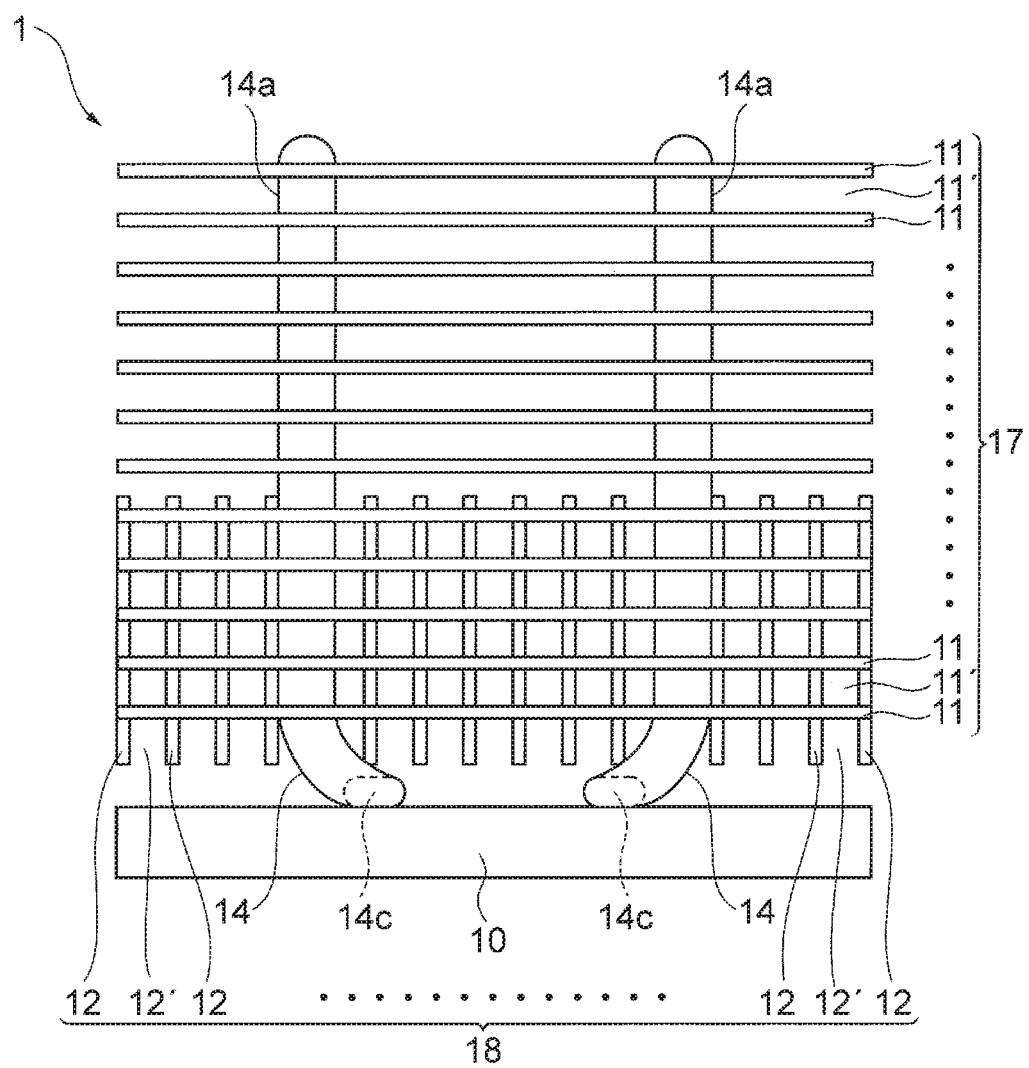
FIG. 2 is a front view of the heat sink according to the first embodiment of the present disclosure.

As shown in FIG. 1 and FIG. 2, the heat sink 1 according to the first embodiment includes: a base plate 10; heat pipes 14; first heat radiating fins 11; second heat radiating fins 12; and third heat radiating fins 13. The base plate 10 is thermally connected to a heat generating element (not shown in the drawing), which is an object to be cooled, on the back surface side, and has a flat plate shape. The heat pipes 14 are erected in the direction from the front surface side of the base plate 10. The first heat radiating fins 11 are thermally connected to the base plate 10 through the heat pipes 14. The second heat radiating fins 12 are disposed adjacently to side end portions of the first heat radiating fins 11 with a first gap portion 15 therebetween. The third heat radiating fins 13 are disposed adjacently to side end portions of the second heat radiating fins 12 with a second gap portion 16 therebetween.

The second heat radiating fins 12 are brought into direct contact with the front surface side of the base plate 10, thus being thermally connected to the base plate 10. The third heat radiating fins 13 are thermally connected to the base plate 10 through the heat pipes 14.

The plurality of first heat radiating fins 11 form a group of first heat radiating fins 17. The plurality of second heat radiating fins 12 form a group of second heat radiating fins 18. The plurality of third heat radiating fins 13 form a group of third heat radiating fins 17. The group of first heat radiating fins 17, the group of second heat radiating fins 18 and the group of third heat radiating fins 19 are mutually arranged in a straight line on the base plate 10.

In the heat sink 1, each first heat radiating fin 11 has a flat plate shape. The plurality of first heat radiating fins 11 are arranged substantially equidistantly from each other in the substantially vertical direction with respect to the front surface of the base plate 10. Further, the first heat radiating fins 11 are arranged such that the surface of each first heat radiating fin 11 extends substantially parallel to the front surface of the base plate 10. In this manner, one group of first heat radiating fins 17 is formed. That is, the group of first heat radiating fins 17 is provided on the front surface of the base plate 10 with a predetermined height dimension, and a pitch between fins of the group of first heat radiating fins 17 is set at a substantially equidistant interval. Accordingly, a first space 11' having a fixed width is formed between each adjacent first heat radiating fins 11, and extends substantially parallel to the front surface of the base plate 10.

In the heat sink 1, the plurality of (two in the drawing) heat pipes 14 are erected in the direction from the front surface side of the base plate 10 such that the heat pipes 14 are arranged side by side in a substantially parallel relationship. A shape of each heat pipe 14 is a U shape as viewed in a side view. Accordingly, the heat pipe 14 having a U shape as viewed in a side view includes two straight portions which face each other, that is, one straight portion 14a and the other straight portion 14b. The heat pipe 14 further includes a bottom portion 14c between one straight portion 14a and the other straight portion 14b.

The bottom portions 14c of the heat pipes 14 having a U shape as viewed in a side view are brought into direct contact with the base plate 10 so that the heat pipes 14 having a U shape as viewed in a side view are thermally connected to the base plate 10. In the heat sink 1, the bottom portions 14c of the heat pipes 14 having a U shape as viewed in a side view are fitted in a recessed groove (not shown in the drawing) formed on the back surface side of the base plate 10 so that the heat pipes 14 having a U shape as viewed in a side view are thermally connected to the base plate 10.

The first heat radiating fins 11 are mounted on one straight portion 14a of the heat pipes 14 having a U shape as viewed in a side view. The first heat radiating fins 11 are brought into direct contact with one straight portion 14a of the heat pipes 14 having a U shape as viewed in a side view so that the first heat radiating fins 11 are thermally connected to the heat pipes 14 having a U shape as viewed in a side view. Eventually, the first heat radiating fins 11 are thermally connected to the base plate 10 through the heat pipes 14 having a U shape as viewed in a side view. Accordingly, the group of first heat radiating fins 17 is arranged on one end portion side of the heat sink 1.

The second heat radiating fins 12 are arranged on the front surface side of the base plate 10 in a region where the bottom portions 14c of the heat pipes 14 having a U shape as viewed in a side view are mounted, that is, at a center portion of the heat sink 1. Each second heat radiating fin 12 has a flat plate shape, and a lower end portion of each second heat radiating fin 12 is mounted on the front surface side of the base plate 10. The lower end portions of the second heat radiating fins 12 are brought into direct contact with the base plate 10 so that the second heat radiating fins 12 are thermally connected to the base plate 10. An end portion of each second heat radiating fin 12 which is disposed on a side opposite to the lower end portion of the second heat radiating fin 12, that is, the distal end portion of the second heat radiating fin 12 forms a free end.

A method for mounting the second heat radiating fins 12 to the front surface side of the base plate 10 is not particularly limited. For example, the method may be a method where the lower end portions of the second heat radiating fins 12 are joined to the front surface side of the base plate 10 by soldering or the like, a method where the lower end portions of the second heat radiating fins 12 are fitted in recessed grooves formed on the front surface side of the base plate 10, or another method.

In the heat sink 1, the plurality of second heat radiating fins 12 are arranged substantially equidistantly from each other along the front surface of the base plate 10. Further, the second heat radiating fins 12 are arranged such that the surface of each second heat radiating fin 12 is substantially vertical with respect to the front surface of the base plate 10. In this manner, one group of second heat radiating fins 18 is formed. Further, each second heat radiating fin 12 is arranged so as to extend in the direction substantially parallel to the arrangement direction of the group of first heat radiating fins 17, the group of second heat radiating fins 18, and the group of third heat radiating fins 19. A pitch between fins of the group of second heat radiating fins 18 is set at a substantially equidistant interval. Accordingly, a second space 12' having a fixed width is formed between each adjacent second heat radiating fins 12, and extends substantially vertically with respect to the front surface of the base plate 10.

The second heat radiating fins 12 are arranged in the region where the bottom portions 14c of the heat pipes 14 having a U shape as viewed in a side view are mounted so that the group of second heat radiating fins 18 is arranged at the center portion of the heat sink 1. The second heat radiating fins 12 are arranged such that the second spaces 12' formed between the second heat radiating fins 12 face the first spaces 11' formed between the first heat radiating fins 11. The side end portions of the first heat radiating fins 11 on the side close to the group of second heat radiating fins 18 and the side end portions of the second heat radiating fins 12 on the side close to the group of first heat radiating fins 17 face each other with the first gap portion 15 therebetween.

The lower end portions of the second heat radiating fins 12 are brought into direct contact with the front surface side of the base plate 10. Accordingly, when a heat generating element is thermally connected to the back surface side of the center portion of the base plate 10, heat is transferred through the second heat radiating fins 12 from the base plate 10 side of the second heat radiating fins 12, that is, from the bottom portion side of the second heat radiating fins 12 to the side opposite of the base plate 10, that is, to the free end side of the second heat radiating fins 12. As a result, the second heat radiating fins 12 exhibit desired heat radiation effect.

Further, in a mode shown in FIG. 1 and FIG. 2, the heights of the second heat radiating fins 12 from the front surface of the base plate 10 are lower than the height of the group of first heat radiating fins 17 from the front surface of the base plate 10. That is, the free ends of the second heat radiating fins 12 are disposed at positions lower than the height of the group of first heat radiating fins 17 from the front surface of the base plate 10. Accordingly, the free ends of the second heat radiating fins 12 are disposed at positions closer to the base plate 10 than at least the first heat radiating fin 11 positioned at the uppermost portion of the plurality of first heat radiating fins 11 forming the group of first heat radiating fins 17. The term "the height of the group of first heat radiating fins 17 from the front surface of the base plate 10" means the dimension between the front surface of the base plate 10 and the first heat radiating fin 11 positioned at the uppermost portion of the group of first heat radiating fins 17. Further, the term "the height of the second heat radiating fin 12 from the front surface of the base plate 10" means the dimension between the front surface of the base plate 10 and the free end of the second heat radiating fin 12.

It is sufficient that at least one of the plurality of second heat radiating fins 12 has a height lower than the height of the group of first heat radiating fins 17 from the front surface of the base plate 10. The number of second heat radiating fins 12 having a height lower than the height of the group of first heat radiating fins 17 from the front surface of the base plate 10 is not particularly limited. In the mode of the heat sink 1, all of the heights of the plurality of second heat radiating fins 12 are lower than the height of the group of first heat radiating fins 17 from the front surface of the base plate 10. In the heat sink 1, the heights of the plurality of second heat radiating fins 12 from the front surface of the base plate 10 are substantially equal to each other. Accordingly, in the mode of the heat sink 1, the height of the group of second heat radiating fins 18 from the front surface of the base plate 10 is lower than the height of the group of first heat radiating fins 17 from the front surface of the base plate 10.

The heights of the second heat radiating fins 12 from the front surface of the base plate 10 are lower than the height of the group of first heat radiating fins 17 from the front surface of the base plate 10 and hence, it is possible to reduce a pressure loss of cooling air which flows through the group of second heat radiating fins 18 and on the leeward side of the group of second heat radiating fins 18. Accordingly, the heat sink 1 can exhibit excellent heat radiation property also at portions on the leeward side of the group of second heat radiating fins 18 along the cooling air flow. The heights of the second heat radiating fins 12 from the front surface of the base plate 10 are lower than the height of the group of first heat radiating fins 17 from the front surface of the base plate 10 and hence, heat density of the second heat radiating fins 12 increases and, as a result, heat radiation efficiency of the second heat radiating fins 12 per unit area is improved. Further, the heights of the second heat radiating fins 12 from the front surface of the base plate 10 are lower than the height of the group of first heat radiating fins 17 from the front surface of the base plate 10 and hence, the weight of the heat sink 1 can be reduced.

From a viewpoint of maintaining a balance between a reduction in pressure loss of cooling air, which flows on the leeward side of the group of second heat radiating fins 18, and heat radiation characteristics of the second heat radiating fins 12, the ratio of the height of the second heat radiating fin 12 from the front surface of the base plate 10 to the height of the group of first heat radiating fins 17 from the front surface of the base plate 10, that is, the ratio of the height of the second heat radiating fin 12 from the front surface of the base plate 10 to the dimension from the front surface of the base plate 10 to the first heat radiating fin 11 positioned at the uppermost portion of the group of first heat radiating fins 17 is preferably set to a value which falls within a range from 0.20 to 0.80. It is more preferable to set the ratio to the value which falls within a range from 0.30 to 0.70, and particularly preferable to set the ratio to the value which falls within a range from 0.35 to 0.60.

As shown in FIG. 2, the second heat radiating fins 12 are arranged such that the surfaces of the second heat radiating fins 12 extend in the direction substantially orthogonal to the surfaces of the first heat radiating fins 11. Accordingly, the first heat radiating fins 11 and the second heat radiating fins 12 are arranged in a matrix array as viewed in a front view. Further, the extending direction of the first spaces 11' formed between the first heat radiating fins 11 extends in the direction substantially orthogonal to the extending direction of the second spaces 12' formed between the second heat radiating fins 12. Further, the heights of the second heat radiating fins 12 from the front surface of the base plate 10 are lower than the height of the group of first heat radiating fins 17 from the front surface of the base plate 10. Accordingly, at portions above the free ends of the second heat radiating fins 12, the second heat radiating fins 12 are not present and hence, the first heat radiating fins 11 and the second heat radiating fins 12 are not arranged in a matrix array.

In a mode shown in FIG. 2, to enhance thermal connectivity between the heat generating element disposed at the center portion of the base plate 10 and the heat pipes 14 having a U shape as viewed in a side view, the bottom portion 14c of each heat pipe 14 having a U shape as viewed in a side view is bent in the direction toward the center portion of the base plate 10.

As shown in FIG. 1, the third heat radiating fins 13 which are heat radiating fins having a flat plate shape are mounted on the other straight portions 14b of the heat pipes 14 having a U shape as viewed in a side view. Accordingly, the third heat radiating fins 13 are arranged on the other end portion side of the heat sink 1. The third heat radiating fins 13 are brought into direct contact with the other straight portions 14b of the heat pipes 14 having a U shape as viewed in a side view so that the third heat radiating fins 13 are thermally connected to the heat pipes 14 having a U shape as viewed in a side view. Eventually, the third heat radiating fins 13 are thermally connected to the base plate 10 through the heat pipes 14 having a U shape as viewed in a side view.

In the heat sink 1, the plurality of third heat radiating fins 13 are arranged substantially equidistantly from each other in the substantially vertical direction with respect to the front surface of the base plate 10. Further, the third heat radiating fins 13 are arranged such that the surface of each third heat radiating fin 13 extends substantially parallel to the front surface of the base plate 10. In this manner, one group of third heat radiating fins 19 is formed. That is, the group of third heat radiating fins 19 is provided on the front surface of the base plate 10 with a predetermined height dimension, and a pitch between fins of the group of third heat radiating fins 19 is set at a substantially equidistant interval. Accordingly, a third space 13' having a fixed width is formed between each adjacent third heat radiating fins 13, and extends substantially parallel to the front surface of the base plate 10.

The third heat radiating fins 13 are arranged on the other end portion side of the heat sink 1 so that the group of third heat radiating fins 19 is arranged on the other end portion side of the heat sink 1. The third heat radiating fins 13 are arranged such that the third spaces 13' formed between the third heat radiating fins 13 face the second spaces 12' formed between the second heat radiating fins 12. The side end portions of the second heat radiating fins 12 on the side close to the group of third heat radiating fins 19 and side end portions of the third heat radiating fins 13 on the side close to the group of second heat radiating fins 18 face each other with the second gap portion 16 therebetween.

In the mode shown in FIG. 1, the heights of the second heat radiating fins 12 from the front surface of the base plate 10 are lower than the height of the group of third heat radiating fins 19 from the front surface of the base plate 10. Accordingly, the free ends of the second heat radiating fins 12 are disposed at positions closer to the base plate 10 than at least the third heat radiating fin 13 positioned at the uppermost portion of the plurality of third heat radiating fins 13 forming the group of third heat radiating fins 19. Further, in the heat sink 1, the height of the group of third heat radiating fins 19 from the front surface of the base plate 10 is substantially equal to the height of the group of first heat radiating fins 17 from the front surface of the base plate 10. The term "the height of the group of third heat radiating fins 19 from the front surface of the base plate 10" means the dimension between the front surface of the base plate 10 and the third heat radiating fin 13 positioned at the uppermost portion of the group of third heat radiating fins 19.

In the heat sink 1, it is possible to reduce a pressure loss of cooling air which flows through the group of second heat radiating fins 18 and on the leeward side of the group of second heat radiating fins 18. Accordingly, the group of third heat radiating fins 19, which may be disposed at a portion on the leeward side of the group of second heat radiating fins 18 along the cooling air flow, can also exhibit excellent heat radiation property.

The third heat radiating fins 13 are arranged such that surfaces of the third heat radiating fins 13 extend in the direction orthogonal to the surfaces of the second heat radiating fins 12. Accordingly, the second heat radiating fins 12 and the third heat radiating fins 13 are arranged in a matrix array as viewed in a back view. Further, the extending direction of the second spaces 12' formed between the second heat radiating fins 12 extends in the direction orthogonal to the extending direction of the third spaces 13' formed between the third heat radiating fins 13. Further, the heights of the second heat radiating fins 12 from the front surface of the base plate 10 are lower than the height of the group of third heat radiating fins 19 from the front surface of the base plate 10. Accordingly, at portions above the free ends of the second heat radiating fins 12, the third heat radiating fins 13 and the second heat radiating fins 12 are not arranged in a matrix array.

The third heat radiating fins 13 are also arranged such that the surfaces of the third heat radiating fins 13 extend in the direction substantially parallel to the surfaces of the first heat radiating fins 11. Further, the extending direction of the third spaces 13' each formed between adjacent third heat radiating fins 13 and the extending direction of the first spaces 11' each formed between adjacent first heat radiating fins 11 are substantially parallel to each other.

Each of the first heat radiating fins 11, the second heat radiating fins 12, the third heat radiating fins 13, and the base plate 10 is formed using a flat plate made of a metal material having excellent thermal conductivity, and is manufactured using aluminum, an aluminum alloy, copper, a copper alloy or the like. A container material for the heat pipe 14 having a U shape as viewed in a side view is also manufactured using a metal material substantially equivalent to a metal material for forming the first heat radiating fins 11, the second heat radiating fins 12, the third heat radiating fins 13, and the base plate 10. As a working fluid for the heat pipe 14 having a U shape as viewed in a side view, a fluid having compatibility with the container, which is a sealed container, is sealed in the heat pipe 14 in a reduced-pressure state. The working fluid may be water, alternative chlorofluorocarbon, perfluorocarbon, cyclopentane or the like, for example.

Cooling air is supplied to the heat sink 1 from the side of the group of first heat radiating fins 17 or the side of the group of third heat radiating fins 19 in the arrangement direction of the group of first heat radiating fins 17, the group of second heat radiating fins 18 and the group of third heat radiating fins 19 and in the direction approximately parallel to the front surface of the base plate 10. In FIG. 1, cooling air is supplied from the side of the group of first heat radiating fins 17 toward the group of third heat radiating fins 19, that is, cooling air is supplied from one end portion of the heat sink 1 toward the other end portion of the heat sink 1. In the heat sink 1, the formation of a boundary layer is suppressed between the first heat radiating fins 11 and the second heat radiating fins 12 and between the second heat radiating fins 12 and the third heat radiating fins 13 and hence, the lowering of heat radiation efficiency of the heat radiating fins can be prevented. Further, cooling air becomes agitated between the first heat radiating fins 11 and the second heat radiating fins 12 and between the second heat radiating fins 12 and the third heat radiating fins 13 and hence, a rate of heat transfer between the heat radiating fins and the cooling air can be enhanced.

As shown in FIG. 1 and FIG. 2, the first heat radiating fins 11 are not mounted on a bent portion of each heat pipe 14 having a U shape as viewed in a side view which is disposed between one straight portion 14a and the bottom portion 14c, and the third heat radiating fins 13 are not mounted on a bent portion of each heat pipe 14 which is disposed between the other straight portion 14b and the bottom portion 14c. Accordingly, cooling air is smoothly supplied to the bottom portion side of the second heat radiating fins 12 and an area around the bottom portions of the second heat radiating fins 12.

Further, in the heat sink 1, the formation of the boundary layer can be suppressed so that the lowering of heat radiation efficiency of the heat radiating fins disposed between one straight portion 14a and the other straight portions 14b of the heat pipe 14 can be also prevented. Accordingly, a size of the bottom portion 14c of the heat pipe 14 having a U shape as viewed in a side view can be increased and, as a result, it is possible to reduce a thermal resistance between the base plate 10 and the heat pipe 14 having a U shape as viewed in a side view.

Next, a heat sink according to a second embodiment of the present disclosure will be described with reference to drawings. Constitutional elements of the heat sink according to the second embodiment substantially equivalent to the constitutional elements of the heat sink according to the first embodiment are described using the same reference symbols as the constitutional elements of the heat sink according to the first embodiment.

Figure 3:
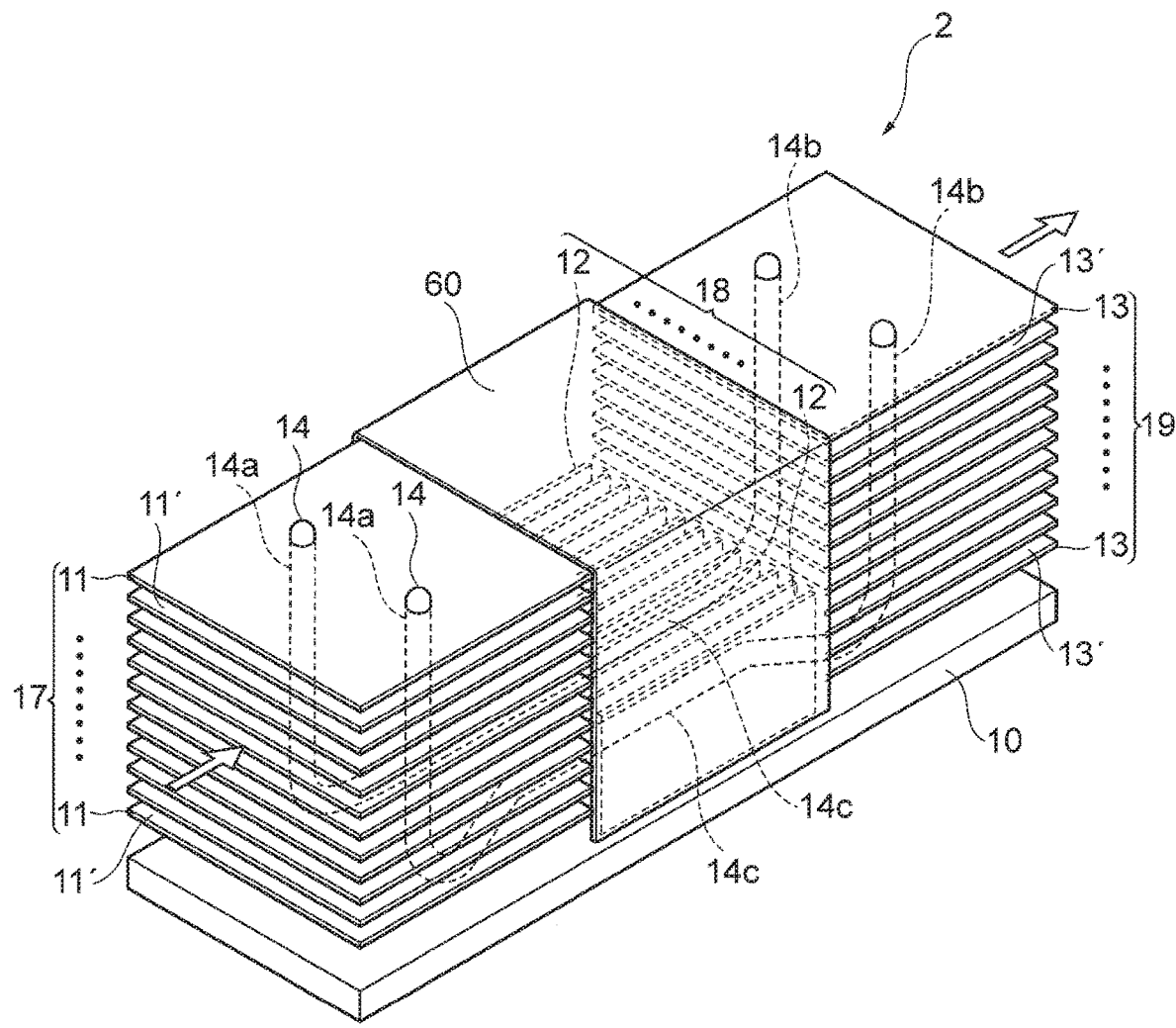
FIG. 3 is a perspective view of a heat sink according to a second embodiment of the present disclosure.

As shown in FIG. 3, the heat sink 2 according to the second embodiment further includes a shielding member 60 at a portion of a group of second heat radiating fins 18. In the heat sink 2, both lateral side surface portions of the group of second heat radiating fins 18 and the free ends of the second heat radiating fins 12 are covered by the shielding member 60. Accordingly, both lateral side surface portions of the group of second heat radiating fins 18 and the free ends of the second heat radiating fins 12 are shielded from the external environment by the shielding member 60. On the other hand, neither of the side end portion of the group of second heat radiating fins 18 on the side close to the group of first heat radiating fins 17 nor the side end portion of the group of second heat radiating fins 18 on the side close to the group of third heat radiating fins 19 are covered by the shielding member 60 so that both side end portions of the group of second heat radiating fins 18 are open.

In the heat sink 2, the shielding member 60 is a member which is formed of three planar portions, and which has a laid-down U shape as viewed in a front view. Covering the group of second heat radiating fins 18 with the shielding member 60 allows both lateral side surface portions of the group of second heat radiating fins 18 and the free ends of the second heat radiating fins 12 to be shielded from the external environment. The height of the shielding member 60 is substantially equal to the height of the group of first heat radiating fins 17 from the front surface of the base plate 10 and to the height of the group of third heat radiating fins 19 from the front surface of the base plate 10.

A material for forming the shielding member 60 may be a metal material having excellent thermal conductivity, such as aluminum, an aluminum alloy, copper, or a copper alloy, for example.

The height of the group of second heat radiating fins 18 from the front surface of the base plate 10 is lower than the height of the group of first heat radiating fins 17 from the front surface of the base plate 10 and lower than the height of the group of third heat radiating fins 19 from the front surface of the base plate 10. Accordingly, although cooling air flows out in the outward direction of the heat sink 2 from both lateral side surface portions and free ends of the group of second heat radiating fins 18, it is possible to prevent the above-mentioned flowing out of the cooling air using the shielding member 60. Therefore, cooling air can be efficiently supplied to the leeward side of the group of second heat radiating fins 18 and, as a result, heat radiation property of the heat sink 2 can be further improved.

Next, a heat sink according to a third embodiment of the present disclosure will be described with reference to the accompanying drawings. Constitutional elements of the heat sink according to the third embodiment substantially equivalent to the constitutional elements of the heat sink according to the first or second embodiment are described using the same reference symbols as the constitutional elements of the heat sink according to the first or second embodiment.

Figure 4:
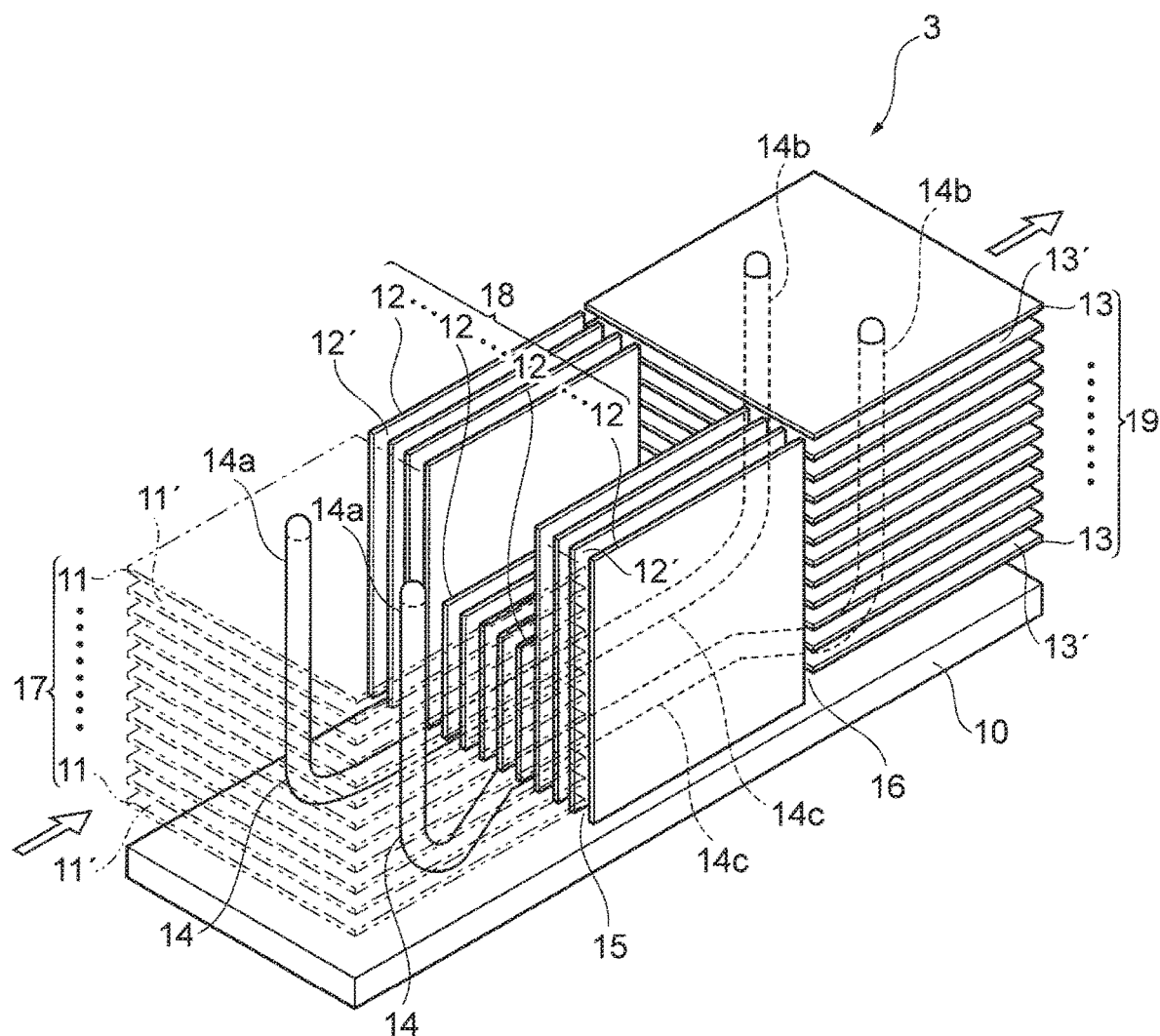
FIG. 4 is a perspective view of a heat sink according to a third embodiment of the present disclosure.

In the heat sink 1 according to the first embodiment, all of the heights of the plurality of second heat radiating fins 12 are substantially equal to each other. However, in place of such a configuration, in a mode of a heat sink 3 according to the third embodiment shown in FIG. 4, only second heat radiating fins 12 disposed at the center portion of a group of second heat radiating fins 18 have heights lower than the height of a group of first heat radiating fins 17 from the front surface of a base plate 10. That is, the second heat radiating fins 12 disposed at the center portion in the arrangement direction of the second heat radiating fins 12 have heights lower than the height of the group of first heat radiating fins 17 from the front surface of the base plate 10. On the other hand, the second heat radiating fins 12 disposed at end portions (that is, end portions of the group of second heat radiating fins 18) in the arrangement direction of the second heat radiating fins 12 have heights substantially equal to the height of the group of first heat radiating fins 17 from the front surface of the base plate 10.

From a viewpoint of maintaining a balance between a reduction in pressure loss of cooling air, which flows on the leeward side of the group of second heat radiating fins 18, and heat radiation characteristics of the second heat radiating fins 12, the ratio of the height, from the front surface of the base plate 10, of the second heat radiating fin 12 disposed at the center portion of the group of second heat radiating fins 18 to the height, from the front surface of the base plate 10, of the second heat radiating fin 12 disposed at the end portion of the group of second heat radiating fins 18 is preferably set to a value which falls within a range from 0.20 to 0.80. It is more preferable to set the ratio to the value which falls within a range from 0.30 to 0.70, and particularly preferable to set the ratio to the value which falls within a range from 0.35 to 0.60.

Also in the heat sink 3, it is possible to reduce a pressure loss of cooling air which flows through the group of second heat radiating fins 18 and on the leeward side of the group of second heat radiating fins 18. Accordingly, a group of third heat radiating fins 19, which may be disposed at a portion on the leeward side of the group of second heat radiating fins 18 along the cooling air flow, can also exhibit excellent heat radiation property.

Next, a heat sink according to a fourth embodiment of the present disclosure will be described with reference to the accompanying drawings. Constitutional elements of the heat sink according to the fourth embodiment substantially equivalent to the constitutional elements of the heat sink according to the first to third embodiment are described using the same reference symbols as the constitutional elements of the heat sink according to the first to third embodiment.

Figure 5:
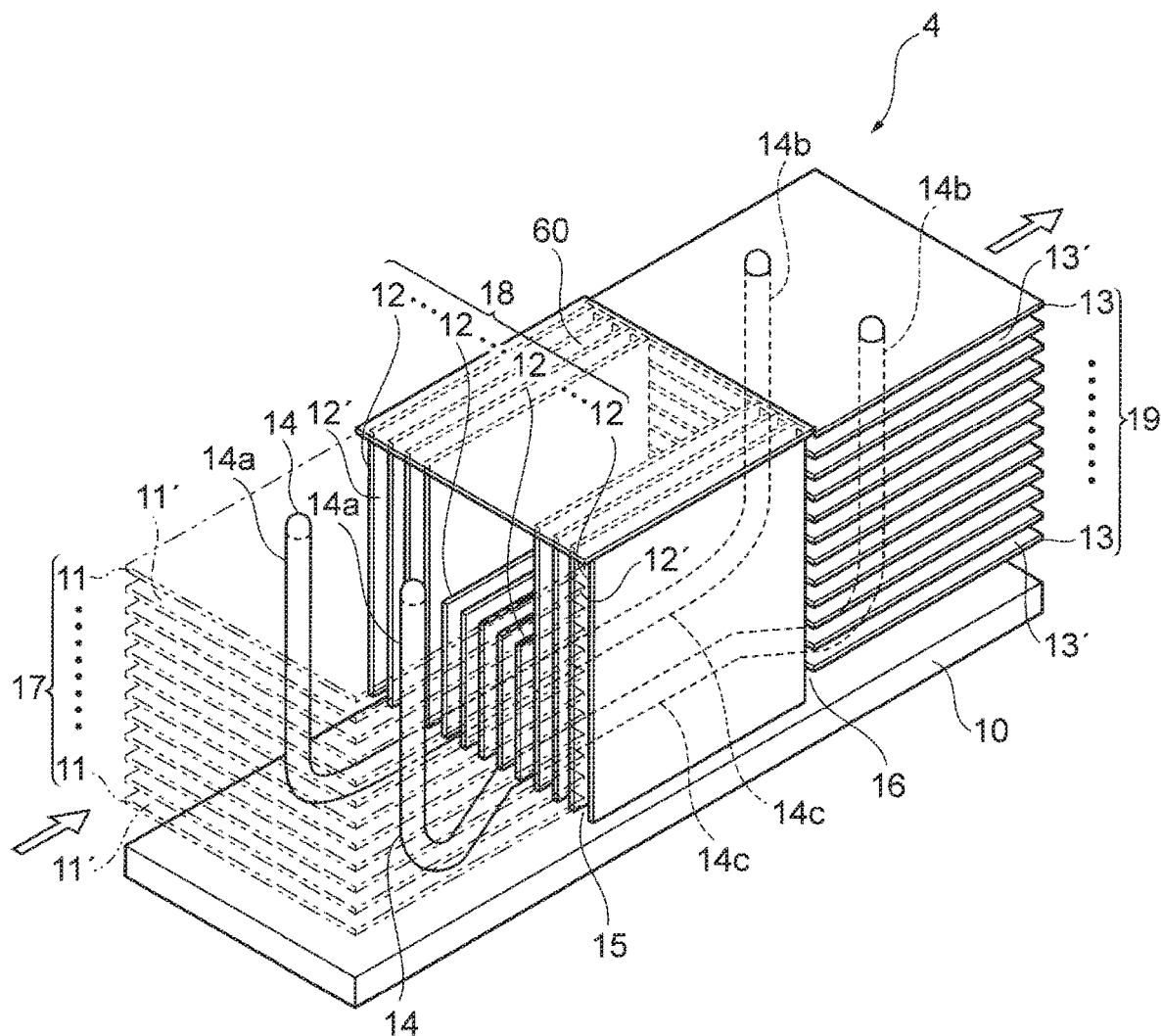
FIG. 5 is a perspective view of a heat sink according to a fourth embodiment of the present disclosure.

As shown in a mode shown in FIG. 5, a heat sink 4 according to the fourth embodiment further includes a shielding member 60 that is provided at a portion of the group of second heat radiating fins 18 of the heat sink 3 according to the third embodiment. In the heat sink 4, the free ends of second heat radiating fins 12 are covered by the shielding member 60. Accordingly, the free ends of a group of second heat radiating fins 18 are shielded from the external environment by the shielding member 60. On the other hand, none of lateral side surface portions of the group of second heat radiating fins 18, that is, none of the side end portion of the group of second heat radiating fins 18 on the side close to a group of first heat radiating fins 17, the side end portion of the group of second heat radiating fins 18 on the side close to a group of third heat radiating fins 19, or either lateral side surface portions of the group of second heat radiating fins 18 are covered by the shielding member 60.

In the heat sink 4, the shielding member 60 is a member having a flat plate shape. Placing the shielding member 60 on the free ends of the second heat radiating fins 12 disposed at the end portions of the group of second heat radiating fins 18 allows the free ends of the second heat radiating fins 12 to be shielded from the external environment. In the heat sink 4, the shape and dimension of the shielding member 60 as viewed in a plan view are substantially equal to the shape and dimension of the group of second heat radiating fins 18 as viewed in a plan view.

The heights of the second heat radiating fins 12, which are disposed at the center portion of the group of second heat radiating fins 18, from the front surface of the base plate 10 are lower than the height of the group of first heat radiating fins 17 from the front surface of the base plate 10 and lower than the height of the group of third heat radiating fins 19 from the front surface of the base plate 10. Accordingly, although cooling air flows out in the outward direction of the heat sink 4 from the free ends at the center portion of the group of second heat radiating fins 18, it is possible to prevent the above-mentioned flowing out of the cooling air using the shielding member 60. Therefore, cooling air can be efficiently supplied to the leeward side of the group of second heat radiating fins 18 and, as a result, heat radiation property of the heat sink 4 can be further improved.

Next, a heat sink according to a fifth embodiment of the present disclosure will be described with reference to the accompanying drawings. Constitutional elements of the heat sink according to the fifth embodiment substantially equivalent to the constitutional elements of the heat sink according to the first to fourth embodiment are described using the same reference symbols as the constitutional elements of the heat sink according to the first to fourth embodiment.

Figure 6:
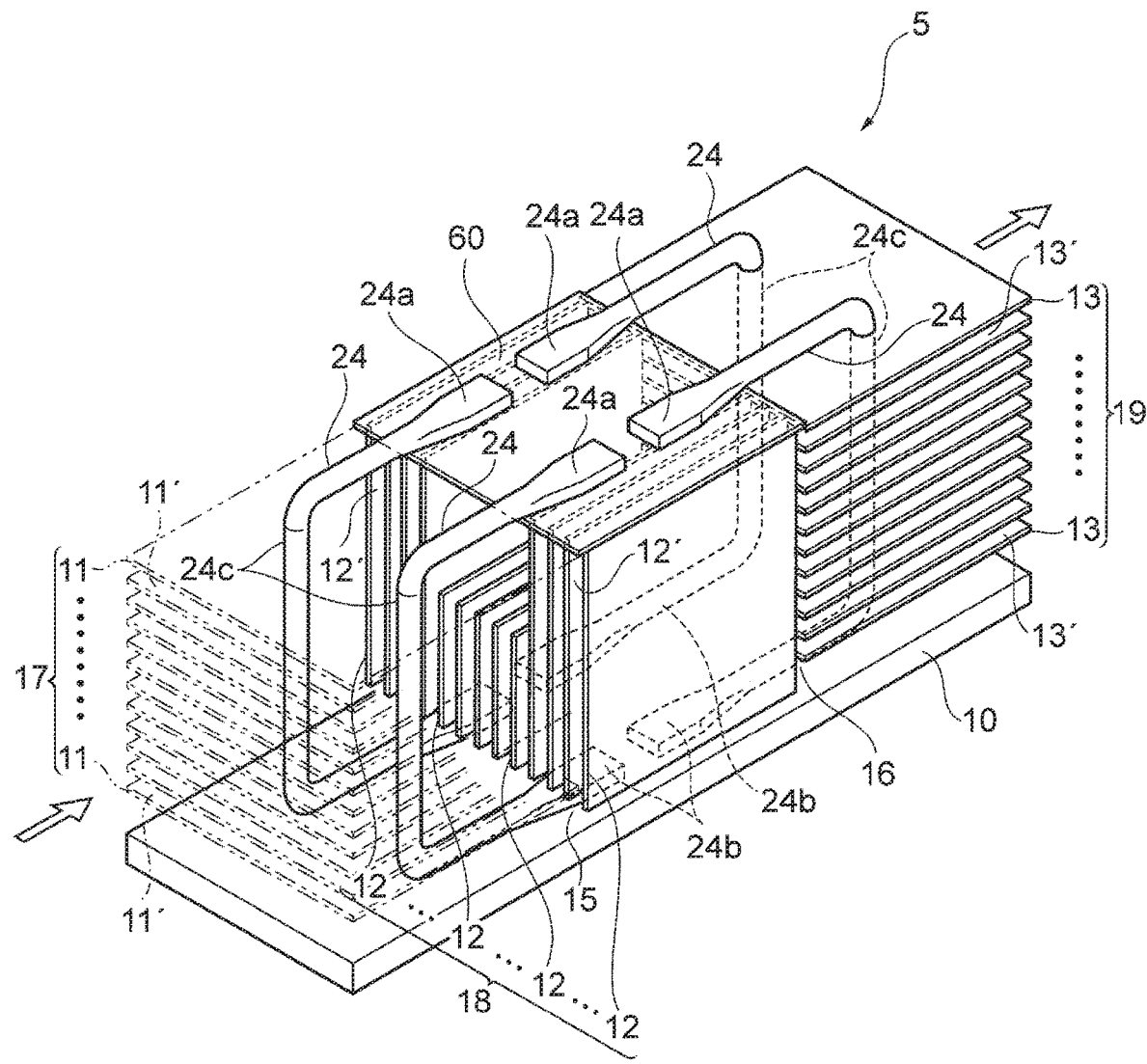
FIG. 6 is a perspective view of a heat sink according to a fifth embodiment of the present disclosure.

In a heat sink 5 according to the fifth embodiment shown in FIG. 6, heat pipes 24 having a laid-down U shape as viewed in a side view are used in place of the heat pipes 14 which have a U shape as viewed in a side view, and which are used in the heat sink 4 according to the fourth embodiment. Each heat pipe 24 having a laid-down U shape as viewed in a side view includes two straight portions which face each other, that is, a top-portion-side straight portion 24a and a bottom-portion-side straight portion 24b. Each heat pipe 24 further includes a straight side portion 24c between the top-portion-side straight portion 24a and the bottom-portion-side straight portion 24b. The heat sink 5 includes the plurality of (four in the drawing) heat pipes 24 having a laid-down U shape as viewed in a side view. Further, two heat pipes 24 having a laid-down U shape as viewed in a side view are erected in the direction from the front surface side of a base plate 10 such that the heat pipes 24 are arranged side by side in an approximate parallel relationship. Two heat pipes 24 and other two heat pipes 24 are arranged in a facing manner. Accordingly, in this mode, the side portions 24c are not erected at a center portion of the heat sink 5, but are erected on one end portion and another end portion of the heat sink 5.

The bottom-portion-side straight portions 24b of the heat pipes 24 having a laid-down U shape as viewed in a side view are brought into direct contact with the base plate 10 so that the heat pipes 24 having a laid-down U shape as viewed in a side view are thermally connected to the base plate 10. In the heat sink 5, the bottom-portion-side straight portions 24b of the heat pipes 24 having a laid-down U shape as viewed in a side view are fitted in a recessed groove (not shown in the drawing) formed on the back surface side of the base plate 10 so that the heat pipes 24 having a laid-down U shape as viewed in a side view are thermally connected to the base plate 10.

A plurality of first heat radiating fins 11 are mounted on the side portions 24c erected on one end portion of the heat sink 5 thus forming a group of first heat radiating fins 17. Further, a plurality of third heat radiating fins 13 are mounted on the side portions 24c erected on the other end portion of the heat sink 5 thus forming a group of third heat radiating fins 19.

Further, a plurality of second heat radiating fins 12 are mounted on the base plate 10, thus forming a group of second heat radiating fins 18. The free ends of the second heat radiating fins 12 disposed at end portions of the group of second heat radiating fins 18 are thermally connected to the top-portion-side straight portions 24a of the heat pipe 24, having a laid-down U shape as viewed in a side view, with the flat-plate-shaped shielding member 60 interposed therebetween. Accordingly, the free ends of the second heat radiating fins 12 disposed at the end portions of the group of second heat radiating fins 18 are thermally connected to the base plate 10 through the heat pipes 24 having a laid-down U shape as viewed in a side view.

In the heat sink 5, heat transferred from a heat generating element not shown in the drawing to the base plate 10 is not only transferred from the base plate 10 to the bottom portion side of the group of second heat radiating fins 18 but also transported from the base plate 10 to free end side of the group of second heat radiating fins 18 through the heat pipes 24 having a laid-down U shape as viewed in a side view. Accordingly, even the group of second heat radiating fins 18 including the second heat radiating fins 18 each having a small fin area can exhibit excellent heat radiation property.

Next, a heat sink according to a sixth embodiment of the present disclosure will be described with reference to the accompanying drawings. Constitutional elements of the heat sink according to the sixth embodiment substantially equivalent to the constitutional elements of the heat sink according to the first to fifth embodiment are described using the same reference symbols as the constitutional elements of the heat sink according to the first to fifth embodiment.

Figure 7:
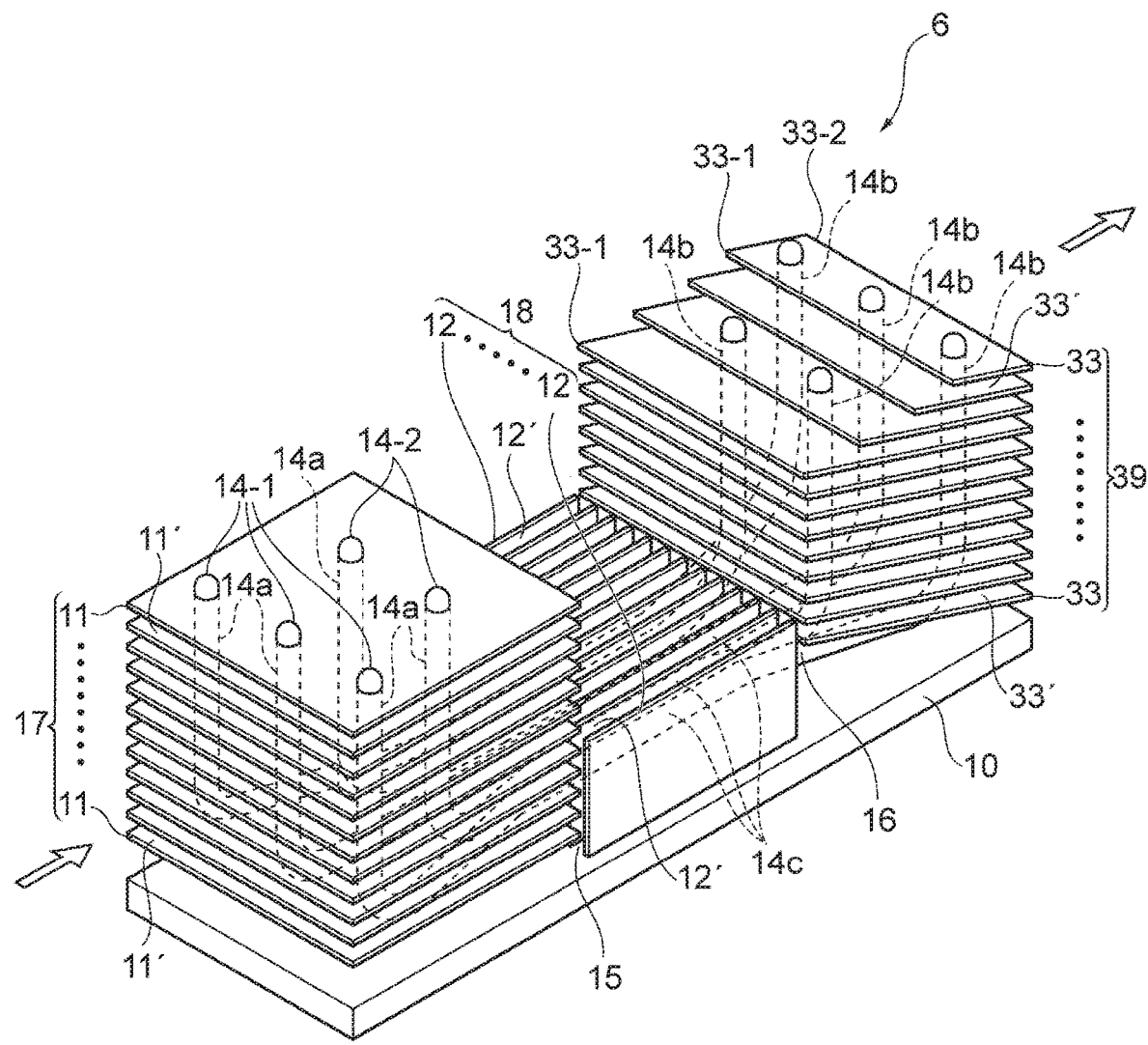
FIG. 7 is a perspective view of a heat sink according to a sixth embodiment of the present disclosure.

In the heat sink 1 according to the first embodiment, the third heat radiating fins 13 are arranged such that the surfaces of the third heat radiating fins 13 extend substantially parallel to the front surface of the base plate 10. However, in the heat sink 6 according to the sixth embodiment shown in FIG. 7, the third heat radiating fins 33 are arranged such that third spaces 33' each formed between the adjacent third heat radiating fins 33 face the second spaces 12' each formed between the adjacent second heat radiating fins 12, and the surfaces of the third heat radiating fins 33 are not parallel to the front surface of the base plate 10. With respect to the third heat radiating fin 33 of the heat sink 6, a side end portion 33-1 disposed on the side which faces the group of second heat radiating fins 18 is disposed at a position higher than a side end portion 33-2 disposed on the side opposite to the side end portion 33-1. That is, the side end portion 33-2 of each third heat radiating fin 33 is disposed at a position closer to the base plate 10 side than the side end portion 33-1 is.

An angle which a surface of each third heat radiating fin 33 makes with respect to the front surface of the base plate 10 is not particularly limited. However, from a viewpoint of making a flow of cooling air smooth between the second spaces 12' and the third spaces 33', the angle is set at approximately 30° in FIG. 7.

In the heat sink 6, the plurality of third heat radiating fins 33 are arranged substantially equidistantly from each other in the substantially vertical direction with respect to the front surface of the base plate 10, thus forming one group of third heat radiating fins 39. The group of third heat radiating fins 39 is provided on the front surface of the base plate 10 with a predetermined height dimension, and a pitch between fins of the group of third heat radiating fins 39 is set at a substantially equidistant interval. The third space 33' having a fixed width is formed between each adjacent third heat radiating fins 33, and extends toward the front surface side of the base plate 10 as the third space 33' is separated by a distance from the group of second heat radiating fins 18. In the heat sink 6, five heat pipes 14 having a U shape as viewed in a side view are provided. The heat pipes 14 having a U shape as viewed in a side view include two kinds of heat pipes. That is, the heat pipes 14 includes: heat pipes 14-1 each having a U shape as viewed in a side view and including a long bottom portion 14c; and heat pipes 14-2 each having a U shape as viewed in a side view and including a short bottom portion 14c. The heat pipes 14-1, each having a U shape as viewed in a side view and including the long bottom portion 14c, and the heat pipes 14-2, each having a U shape as viewed in a side view and including the short bottom portion 14c, are erected side by side in an approximate parallel relationship such that the heat pipes 14-1 and the heat pipes 14-2 are disposed adjacently to each other. Accordingly, the straight portions 14a of the heat pipes 14 disposed on one side are arranged in a staggered manner, and the straight portions 14b of the heat pipes 14 disposed on another side are also arranged in a staggered manner.

The third spaces 33' extend toward the front surface side of the base plate 10 as the third spaces 33' are separated by a distance from the group of second heat radiating fins 18. Accordingly, in the case where cooling air is supplied in the direction from the group of first heat radiating fins 17 to the group of third heat radiating fins 39, and a member to be cooled having a short height is arranged on the leeward side of the heat sink 6, not only a heat generating element (not shown in the drawing) thermally connected to the base plate 10 but also the member to be cooled having a short height which is arranged on the leeward side of the heat sink 6 can be cooled by the cooling air which flows through the heat sink 6.

Next, a heat sink according to a seventh embodiment of the present disclosure will be described with reference to the accompanying drawings. Constitutional elements of the heat sink according to the seventh embodiment substantially equivalent to the constitutional elements of the heat sink according to the first to sixth embodiment are described using the same reference symbols as the constitutional elements of the heat sink according to the first to sixth embodiment.

Figure 8:
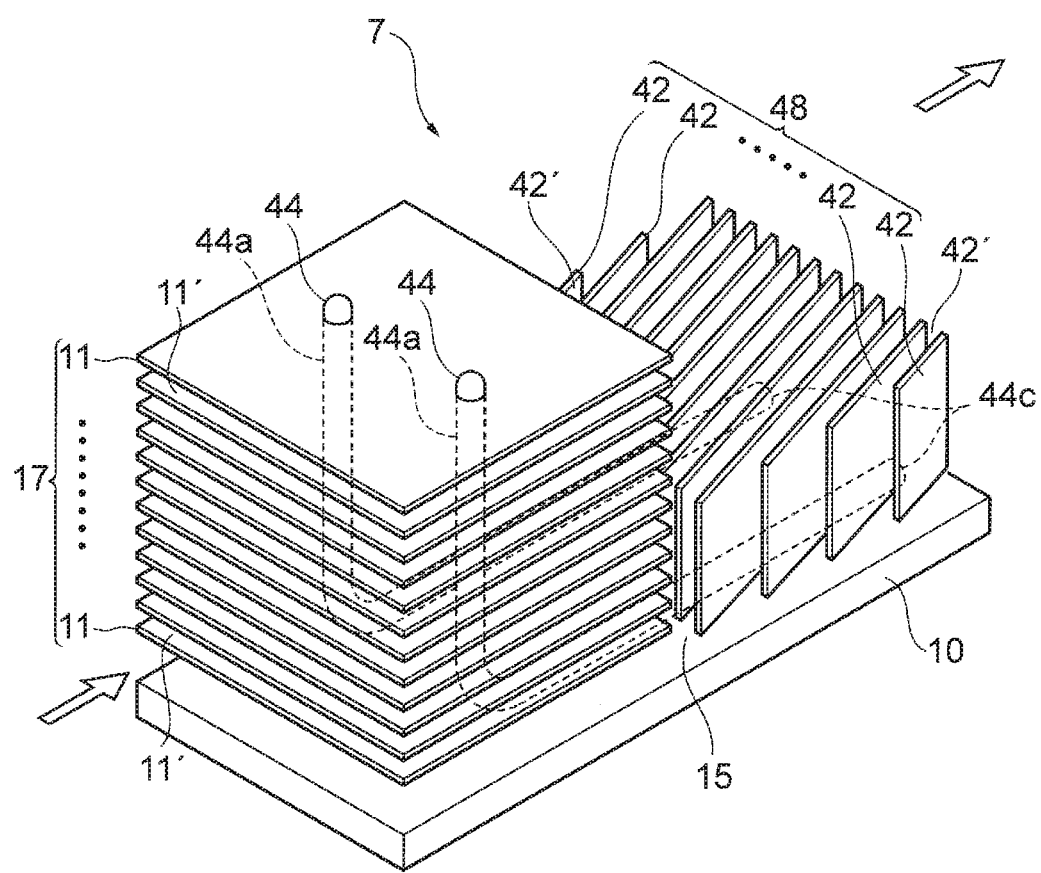
FIG. 8 is a perspective view of a heat sink according to a seventh embodiment of the present disclosure.

In the heat sink 7 according to the seventh embodiment shown in FIG. 8, heat pipes 44 having an L shape as viewed in a side view are used in place of the heat pipes 14 having a U shape as viewed in a side view. Accordingly, unlike the above-mentioned respective embodiments, the heat sink 7 does not include a group of third heat radiating fins. In the heat sink 1 according to the first embodiment, the second heat radiating fins 12 are arranged such that the surfaces of the second heat radiating fins 12 extend in the direction substantially parallel to the arrangement direction of the group of first heat radiating fins 17, the group of second heat radiating fins 18, and the group of third heat radiating fins 19. On the other hand, in the heat sink 7 according to the seventh embodiment, second heat radiating fins 42 are arranged such that second spaces 42' each formed between the adjacent second heat radiating fins 42 face first spaces 11' each formed between the adjacent first heat radiating fins 11, and surfaces of the second heat radiating fins 42 are positioned so as to extend in a direction which is not parallel to the arrangement direction of a group of first heat radiating fins 17 and a group of second heat radiating fins 48.

An angle which the surface of each second heat radiating fin 42 makes with respect to the above-mentioned arrangement direction is not particularly limited. However, from a viewpoint of making a flow of cooling air smooth between the first spaces 11' and the second spaces 42', the angle is set at approximately 30° in FIG. 8.

In the heat sink 7, the plurality of (two in the drawing) heat pipes 44 having an L shape as viewed in a side view are erected in the direction from the front surface side of the base plate 10 such that the heat pipes 44 are arranged side by side in a substantially parallel relationship. Each heat pipe 44 having an L shape as viewed in a side view includes one straight portion 44a and one bottom portion 44c.

The bottom portions 44c of the heat pipes 44 having an L shape as viewed in a side view are brought into direct contact with the base plate 10 so that the heat pipes 44 having an L shape as viewed in a side view are thermally connected to the base plate 10. In the heat sink 7, the bottom portions 44c of the heat pipes 44 having an L shape as viewed in a side view are fitted in a recessed groove (not shown in the drawing) formed on the back surface side of the base plate 10 so that the heat pipes 44 having an L shape as viewed in a side view are thermally connected to the base plate 10.

The first heat radiating fins 11 are mounted on the straight portions 44a of the heat pipes 44 having an L shape as viewed in a side view. The plurality of first heat radiating fins 11 are mounted on the straight portions 44a of the heat pipes 44 having an L shape as viewed in a side view thus forming a group of first heat radiating fins 17. In the heat sink 7, the group of first heat radiating fins 17 is arranged at a portion of the heat sink 7 located between a center portion of the heat sink 7 and one end portion of the heat sink 7.

In the heat sink 7, the second heat radiating fins 42 are arranged such that surfaces of the second heat radiating fins 42 are substantially vertical with respect to the front surface of the base plate 10. The group of second heat radiating fins 48 is arranged at a portion of the heat sink 7 located between the center portion of the heat sink 7 and the other end portion of the heat sink 7.

Also in the heat sink 7, the height of the second heat radiating fins 42 from the front surface of the base plate 10 is lower than the height of the group of first heat radiating fins 17 from the front surface of the base plate 10. Accordingly, it is possible to reduce a pressure loss of cooling air which flows through the group of second heat radiating fins 48 and on the leeward side of the group of second heat radiating fins 48. Assume a case where cooling air is supplied in the direction from the group of first heat radiating fins 17 to the group of second heat radiating fins 48, and a member to be cooled is arranged on the oblique leeward side of the heat sink 7. In such a case, not only a heat generating element (not shown in the drawing) thermally connected to the base plate 10 but also the member to be cooled arranged on the oblique leeward side of the heat sink 7 can be cooled by the cooling air.

Even when two groups of heat radiating fins are provided and the second heat radiating fins 42 are arranged such that surfaces of the second heat radiating fins 42 extend in the direction which is not substantially parallel to the arrangement direction of the group of first heat radiating fins 17 and the group of second heat radiating fins 48, the formation of a boundary layer is suppressed between the first heat radiating fins 11 and the group of second heat radiating fins 42. Accordingly, the lowering of heat radiation efficiency of the heat radiating fins can be prevented. Further, a disturbance in the flow of cooling air is generated between the first heat radiating fins 11 and the second heat radiating fins 42 and hence, a rate of heat transfer between the heat radiating fins and the cooling air can be enhanced.

Next, a heat sink according to an eighth embodiment of the present disclosure will be described with reference to drawings. Constitutional elements of the heat sink according to the eighth embodiment substantially equivalent to the constitutional elements of the heat sink according to the first to seventh embodiments are described using the same reference symbols as the constitutional elements of the heat sink according to the first embodiment.

Figure 9:
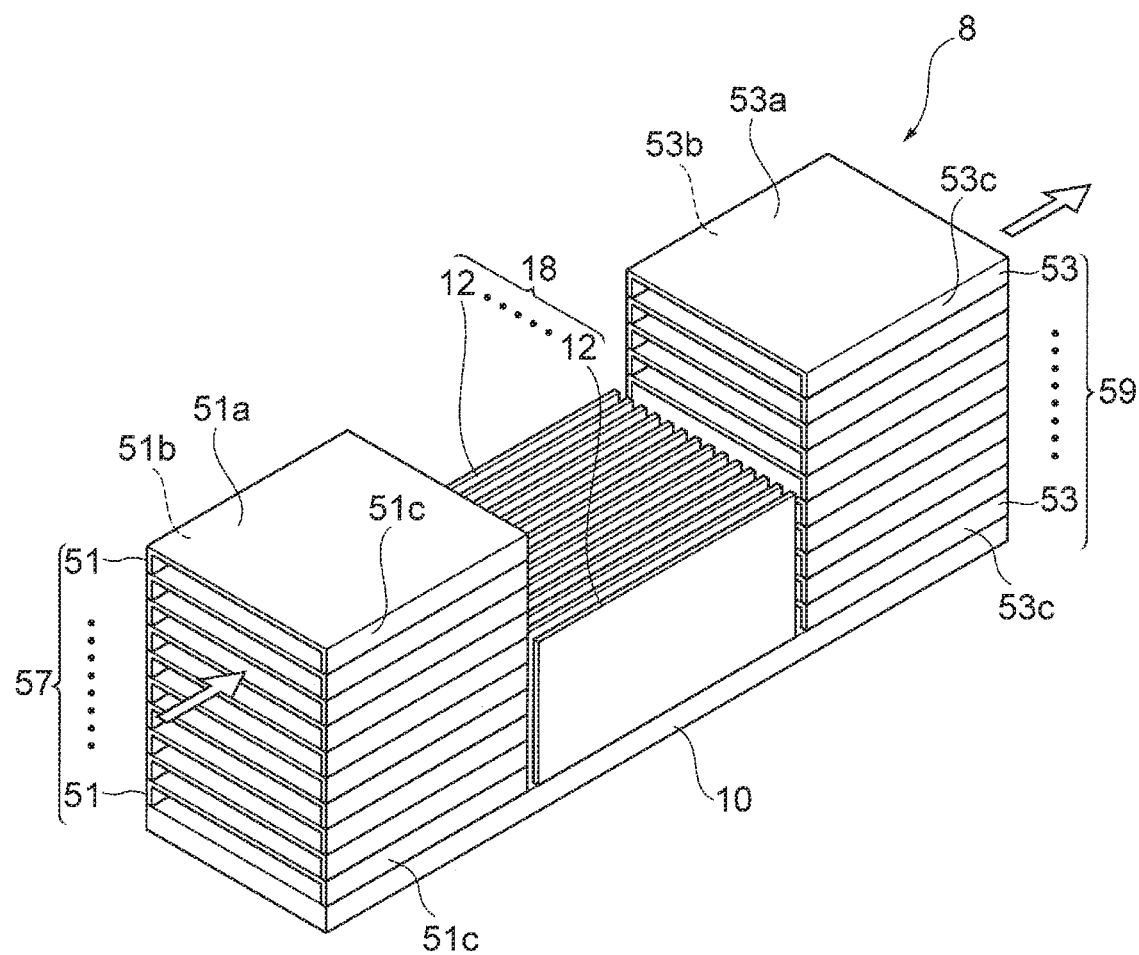
FIG. 9 is a perspective view of a heat sink according to an eighth embodiment of the present disclosure.

As shown in FIG. 9, in the heat sink 8 according to the eighth embodiment, no heat pipes are provided, and first heat radiating fins 51 and third heat radiating fins 53 are directly thermally connected to the base plate 10 without the connection of a heat conductive member such as a heat pipe.

Each first heat radiating fins 51 is formed of a flat-plate-shaped fin portion 51a and leg portions 51b, 51c erected at both edge portions of the flat-plate-shaped fin portion 51a. The plurality of first heat radiating fins 51 are stacked with each other thus forming a group of first heat radiating fins 57. The group of first heat radiating fins 57 is arranged such that cooling air flows through each space defined between the leg portion 51b and the leg portion 51c. The leg portions 51b, 51c of first heat radiating fins 51 also function as shielding walls which prevent cooling air flowing through the group of first heat radiating fins 57 from flowing out to the outside of the group of first heat radiating fins 57 from the lateral side surfaces of the group of first heat radiating fins 57. Accordingly, the group of first heat radiating fins 57 can supply cooling air to the group of second heat radiating fins 18 with more certainty.

The flat-plate-shaped fin portions 51a are arranged substantially equidistantly in the substantially vertical direction with respect to the front surface of the base plate 10 (that is, at intervals of a length of the leg portion 51b, 51c). Further, the flat-plate-shaped fin portions 51a are arranged such that surfaces of the flat-plate-shaped fin portions 51a are substantially parallel to the front surface of the base plate 10. In the heat sink 8, the leg portions 51b, 51c of the first heat radiating fins 51 are thermally connected to the base plate 10.

Each third heat radiating fin 53 is formed of a flat-plate-shaped fin portion 53a and leg portions 53b, 53c erected at both edge portions of the flat-plate-shaped fin portion 53a. The plurality of third heat radiating fins 53 are stacked with each other thus forming a group of third heat radiating fins 59. The group of third heat radiating fins 59 is arranged such that cooling air flows through each space defined between the leg portion 53b and the leg portion 53c. The leg portions 53b, 53c of the third heat radiating fins 53 also function as shielding walls which prevent cooling air flowing through the group of third heat radiating fins 59 from flowing out to the outside of the group of third heat radiating fins 59 from the lateral side surfaces of the group of third heat radiating fins 59. Accordingly, the group of third heat radiating fins 59 can supply cooling air to the downstream side in the heat sink 8 with more certainty.

The flat-plate-shaped fin portions 53a are arranged substantially equidistantly from each other in the substantially vertical direction with respect to the front surface of the base plate 10 (that is, at intervals of a length of the leg portion 53b, 53c). Further, the flat-plate-shaped fin portions 53a are arranged such that surfaces of the flat-plate-shaped fin portions 53a extend substantially parallel to the front surface of the base plate 10. In the heat sink 8, the leg portions 53b, 53c of the third heat radiating fins 53 are thermally connected to the base plate 10.

Next, an example of a method for using the heat sink according to the present disclosure is described. In the present embodiment, the example of a use method is described using the heat sink 1 according to the first embodiment. In the case where cooling air is supplied to the heat sink 1 in the direction from the group of first heat radiating fins 17, the heat sink 1 is installed such that the flow direction of the cooling air extends in the direction substantially parallel to the surfaces of the first heat radiating fins 11. A portion of the base plate 10 to which a heat generating element (not shown in the drawing) is thermally connected is not particularly limited. However, for example, the center portion of the base plate 10, that is, a position of the base plate 10 which corresponds to a portion to which the second heat radiating fins 12 are mounted and a position of the base plate 10 which corresponds to a portion to which the bottom portions 14c of the heat pipes 14 having a U shape as viewed in a side view are mounted can be named.

Next, other embodiments of the heat sink according to the present disclosure will be described. In the above-mentioned sixth and seventh embodiments, the shielding member is not provided. However, the shielding member may be further provided at a portion of the group of second heat radiating fins when necessary. The above-mentioned shielding member may be a member which is formed of three planar portions, and which has a laid-down U shape as viewed in a front view, for example. The height of the shielding member may be the height substantially equal to the height of the group of first heat radiating fins from the front surface of the base plate and substantially equal to the height of the group of third heat radiating fins from the front surface of the base plate.

In the above-mentioned respective embodiments, the second heat radiating fins having the heights lower than the height of the group of first heat radiating fins from the front surface of the base plate have substantially the same height. However, in place of such a configuration, the second heat radiating fins may have different heights provided that the second heat radiating fins have heights lower than the height of the group of first heat radiating fins from the front surface of the base plate.

In the above-mentioned respective embodiments, the second heat radiating fins are arranged such that the surfaces of the second heat radiating fins extend in the direction substantially orthogonal to the surfaces of the first heat radiating fins. However, it is sufficient that the surfaces of the second heat radiating fins and the surfaces of the first heat radiating fins are not parallel to each other. For example, the second heat radiating fins may be erected on the base plate such that the surface of each second heat radiating fin makes an angle other than a vertical angle, that is, an angle of more than 0° and less than 90° (for example, more than or equal to 70° and less than 90°) with respect to the front surface of the base plate. Alternatively, the first heat radiating fins and/or the third heat radiating fins may be arranged such that the surface of each first heat radiating fin and/or the surface of each third heat radiating fin make an angle at which the first heat radiating fins and/or the third heat radiating fins are not parallel to the front surface of the base plate in the arrangement direction of the second heat radiating fins. That is, the first heat radiating fins and/or the third heat radiating fins may be arranged such that the surface of each first heat radiating fin and/or the surface of each third heat radiating fin make an angle of more than 0° and less than 90° with respect to the front surface of the base plate (for example, an angle of more than 0° and less than 30° with respect to the front surface of the base plate) in the arrangement direction of the second heat radiating fins.

Further, in the heat sinks according to the first to fifth, and seventh embodiments, the straight portions of the heat pipes having the same shape and the same size are erected on the base plate side by side. However, in place of such a configuration, three or more heat pipes may be provided, and the heat pipes may be installed such that the straight portions of the heat pipes are arranged in a staggered manner so as to make a flow of cooling air smooth in a heat sink.

The heat pipes are used in the above-mentioned first to seventh embodiments. However, in place of the heat pipes or together with the heat pipes, metal (for example, aluminum, copper or the like) having thermal conductivity of 100 W/(m·K) or more at 25° C. may be used. In the above-mentioned respective embodiments, pitch between fins of the group of first heat radiating fins 17 is set at an equidistant interval. However, the heat radiating fins in the group of heat radiating fins may not be arranged at equidistant intervals. The heat radiating fins may be arranged in a mode where some heat radiating fins are omitted from a plurality of heat radiating fins arranged equidistantly. By adopting such a mode where some heat radiating fins are omitted, larger amount of cooling air can be supplied to the leeward side.

In the above-mentioned respective embodiments, a shape of each second heat radiating fin is a flat plate shape. However, to enable joining of each second heat radiating fin to the base plate, the second heat radiating fin may have an L shape or a laid-down U shape when necessary.

According to the heat sink of the present disclosure, the formation of a boundary layer on surfaces of the heat radiating fins is suppressed so that portions other than on the windward side along the cooling air flow can also exhibit excellent heat radiation property. Accordingly, the heat sink of the present disclosure is applicable in wide-range of fields. For example, the heat sink of the present disclosure has a high utility value in a field of cooling an electronic component mounted on a mobile body, such as a railway vehicle, an aircraft, or an automobile, or on an electronic apparatus.

What is claimed is:

1. A heat sink comprising:
   a base plate;
   first heat radiating fins, second heat radiating fins and third heat radiating fins are mutually arranged in a straight line on the base plate, wherein at least one first heat radiating fin of the first heat radiating fins is thermally connected to the base plate,
   wherein at least one second heat radiating fin of the second heat radiating fins is disposed adjacently to a side end portion of the at least one first heat radiating fin and thermally connected to the base plate, wherein
   at least one third heat radiating fin of the third heat radiating fins is disposed adjacently to a side end portion of a side of the at least one second heat radiating fin opposite the side end portion of the at least one first heat radiating fin and thermally connected to the base plate,
   wherein
      a surface of the at least one first heat radiating fin is not parallel to a surface of the at least one second heat radiating fin, a surface of the at least one third heat radiating fin is not parallel to the surface of the at least one second heat radiating fin,
   the at least one first heat radiating fin is thermally connected to the base plate through a same heat conductive member as the at least one third heat radiating fin,
   a lower end portion of the at least one second heat radiating fin comes into contact with a front surface the base plate so that the at least one second heat radiating fin is thermally connected to the base plate, and
   heights of the second heat radiating fins from the front surface of the base plate are lower than a height of a group of the first heat radiating fins and a height of a group of the third radiating fins from the front surface of the base plate, and wherein
   a ratio of a height of at least one of the second heat radiating fins to the height of the group of the first heat radiating fins and the height of the group of the third heat radiating fins is set to a value which falls within a range from 0.35 to 0.60.

2. The heat sink according to claim 1, wherein
   a plurality of the second heat radiating fins are arranged along the front surface of the base plate to form a group of second heat radiating fins, and at least one of the second heat radiating fins disposed at a center portion of the group of second heat radiating fins is disposed at a position closer to the base plate than a first heat radiating fin positioned at an uppermost portion and a third heat radiating fin positioned at the uppermost portion.

3. The heat sink according to claim 1, wherein
   a shielding member is further provided to a free end of the second heat radiating fin on a side opposite to the lower end portion of the second heat radiating fin, the shielding member shielding the free end from an external environment.

4. The heat sink according to claim 1, wherein the heat conductive member is a heat pipe.

5. The heat sink according to claim 4, wherein a shape of the heat pipe is a U shape as viewed in a side view of the heat sink, an L shape as viewed in a side view of the heat sink or a laid-down U shape as viewed in a side view of the heat sink.

6. The heat sink according to claim 5, the heat pipe having a U shape as viewed in a side view of the heat sink and includes a first straight portion and a second straight portion, wherein the first straight portion faces the second straight portion, and a bottom portion coupled between the first straight portion and the second straight portion, and
   wherein the first heat radiating fins are not mounted on a bent portion of each heat pipe having a U shape as viewed in the side view of the heat sink Which is disposed between the first straight portion and the bottom portion, and the third heat radiating fins are not mounted on a bent portion of each heat pipe which is disposed between the second straight portion and the bottom portion.

* * * * *